United States Patent
Wang et al.

(10) Patent No.: US 12,287,555 B2
(45) Date of Patent: Apr. 29, 2025

(54) PHOTOSENSITIVE DEVICE AND DISPLAY PANEL

(71) Applicant: Shenzhen China Star Optoelectronics Semiconductor Display Technology Co., Ltd., Guangdong (CN)

(72) Inventors: Haijun Wang, Guangdong (CN); Xin Zhang, Guangdong (CN); Miao Jiang, Guangdong (CN); Jiangbo Yao, Guangdong (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 491 days.

(21) Appl. No.: 17/254,938

(22) PCT Filed: Dec. 14, 2020

(86) PCT No.: PCT/CN2020/136101
§ 371 (c)(1),
(2) Date: Dec. 22, 2020

(87) PCT Pub. No.: WO2022/110331
PCT Pub. Date: Jun. 2, 2022

(65) Prior Publication Data
US 2022/0350184 A1 Nov. 3, 2022

(30) Foreign Application Priority Data
Nov. 27, 2020 (CN) .......................... 202011358092.2

(51) Int. Cl.
*G02F 1/1368* (2006.01)
*G02F 1/1362* (2006.01)
*H10F 30/282* (2025.01)

(52) U.S. Cl.
CPC ...... *G02F 1/1368* (2013.01); *G02F 1/136209* (2013.01); *H10F 30/282* (2025.01)

(58) Field of Classification Search
CPC ............. G02F 1/1368; G02F 1/136209; H01L 31/1136; H01L 31/02322
See application file for complete search history.

(56) References Cited

U.S. PATENT DOCUMENTS

| | | | |
|---|---|---|---|
| 2011/0156184 A1* | 6/2011 | Ninkov | H01L 27/1462 257/E31.127 |
| 2018/0120614 A1* | 5/2018 | Shin | G09G 3/3607 |
| 2019/0115508 A1* | 4/2019 | Lin | H01L 31/02325 |

FOREIGN PATENT DOCUMENTS

| | | |
|---|---|---|
| CN | 1916744 | 2/2007 |
| CN | 105552131 | 5/2016 |

(Continued)

OTHER PUBLICATIONS

CN 1916744 translation (Year: 2007).*

(Continued)

*Primary Examiner* — James A Dudek

(57) ABSTRACT

A photosensitive device and a display panel are provided. The photosensitive device includes a substrate and a photosensitive functional layer. The photosensitive functional layer includes a thin film transistor layer and a quantum dot layer. The quantum dot layer is configured to emit an excitation light under an excitation of an external light. A photo-generated current efficiency of the photosensitive device can be improved, and stability and versatility of the photosensitive device can also be improved.

7 Claims, 2 Drawing Sheets

(56) References Cited

FOREIGN PATENT DOCUMENTS

| CN | 109860328 | 6/2019 |
|---|---|---|
| JP | 2017-022059 | 1/2017 |
| JP | 6586805 | 10/2019 |

OTHER PUBLICATIONS

CN 106468858 A machine translation (Year: 2017).*
CN 109652076 A machine translation (Year: 2019).*
CN 111117603 A machine translation (Year: 2020).*

* cited by examiner

PHOTOSENSITIVE DEVICE AND DISPLAY PANEL

RELATED APPLICATIONS

This application is a National Phase of PCT Patent Application No. PCT/CN2020/136101having International filing date of Dec. 14, 2020, which claims the benefit of priority of Chinese Patent Application No. 202011358092.2 filed on Nov. 27, 2020. The contents of the above applications are all incorporated by reference as if fully set forth herein in their entirety.

FIELD AND BACKGROUND OF THE INVENTION

The present disclosure relates to the field of display technologies, in particular to a photosensitive device and a display panel.

Thin film transistor liquid crystal displays (TFT-LCDs) are widely used in a current flat panel display industry due to their lightness, thinness, small size, low power consumption, no radiation, and relatively low manufacturing costs. In order to broaden commercial and household functions of the LCDs, many functions are now integrated into the displays, such as color temperature sensing, laser sensing, or gas sensing, etc., to improve applications of the LCDs. However, many integrated functions are in a new development stage, and there are still many processes and related designs that need to be improved in order to improve performance of the LCDs with multiple integrated functions.

At present, in order for the display to have functions of light source sensing and image conversion, it is usually necessary to capture a light source and convert it into an electrical signal, and then to transmit the electrical signal to the display. The display performs an image conversion according to the electrical signal, so that a function of controlling the display by the external light source can be realized.

When a photosensitive thin film transistor (TFT) is used as a photoelectric conversion element that realizes the above-mentioned light source control screen function, an active layer of the photosensitive TFT generates photo-generated carriers when irradiated by light. A gate, a source, and a drain of the photosensitive TFT can generate current when an appropriate voltage is applied to realize a photo-electric function. A current signal is further transferred to a screen with display function, so that a corresponding position of the screen changes in color, and the light source control screen function is realized.

However, as material or a thickness of the active layer of the photosensitive TFT is different, different materials and different film thicknesses have different absorption intensities and absorption capabilities for light sources having different wavelengths. For example, when a main material of the active layer is a-Si, as the film thickness of the active layer changes from 50 nm to 1 um, the absorption intensity and absorption capacity corresponding to the wavelengths of 300 nm to 1100 nm change accordingly. In order to maximize an absorption rate of the light source by the active layer made of the a-Si material and maximize the photo-generated current, it is necessary to select a light source wavelength corresponding to the highest absorption intensity under a film thickness of the active layer made of the a-Si material to illuminate the light source sensing TFT, so as to achieve a maximum light source conversion current efficiency of the light source sensing TFT.

To achieve the above effects, it is necessary to replace light sources with different wavelengths when the active layer has different film thicknesses. For example, laser pointers of different wavelengths are selected. Therefore, a cost is increased, and a versatility of the photosensitive TFT is lower, which limits the use and development of the photosensitive TFT.

Accordingly, it is necessary to provide a photosensitive device and a display panel to solve the above technical problems.

SUMMARY OF THE INVENTION

To solve the above problems, the present disclosure provides a photosensitive device and a display panel. A photosensitive functional layer includes a quantum dot layer and a thin film transistor layer, and the quantum dot layer can be configured to convert an external light into light having a wavelength within a predetermined wavelength range with the highest absorption intensity of the thin film transistor layer. Therefore, a conversion rate of a photo-generated current of the thin film transistor layer is improved, and stability and versatility of a photosensitive function of the thin film transistor layer are also improved.

The present disclosure provides a photosensitive device. The photosensitive device includes a substrate and a photosensitive functional layer disposed on the substrate. The photosensitive functional layer includes a thin film transistor layer and a quantum dot layer. The quantum dot layer is disposed on the substrate and is configured to emit an excitation light having a wavelength within a predetermined wavelength range under an excitation of an external light, and the thin film transistor layer has a highest absorption intensity of the excitation light. The thin film transistor layer is disposed on a surface of the quantum dot layer facing away from or facing the substrate, and the thin film transistor layer is configured to absorb the external light or the excitation light incident on its surface to perform a photoelectric conversion operation.

Furthermore, the photosensitive device further includes a light shielding layer disposed on a surface of the substrate facing or away from the photosensitive functional layer.

Furthermore, the thin film transistor layer includes at least one kind of an amorphous silicon thin film transistor and an oxide thin film transistor.

Furthermore, the quantum dot layer includes an adhesive layer and a plurality of quantum dots filled in the adhesive layer.

Furthermore, the thin film transistor layer comprises a gate, a first insulating layer, an active layer, a source, a drain, a second insulating layer, a first electrode, and a second electrode. The gate is disposed on the substrate or the quantum dot layer. The first insulating layer is disposed on the gate and covers the gate and the substrate or the quantum dot layer. The active layer is disposed on the first insulating layer and covers the first insulating layer. The source and the drain are disposed on the active layer and respectively disposed at two opposite edge regions of the active layer. The second insulating layer is disposed on the source and the drain and covers the source, the drain, and the active layer. The first electrode and the second electrode are disposed on the second insulating layer and respectively disposed in regions of the second insulating layer corresponding to the source and the drain. The second electrode is electrically connected to the drain.

The present disclosure provides a photosensitive device. The photosensitive device includes a substrate and a photosensitive functional layer disposed on the substrate. The photosensitive functional layer includes a thin film transistor layer and a quantum dot layer. The quantum dot layer is configured to emit an excitation light under an excitation of an external light.

Furthermore, the thin film transistor layer is disposed on a surface of the quantum dot layer facing away from the substrate, and the thin film transistor layer is configured to absorb the external light or the excitation light incident on its surface to perform a photoelectric conversion operation.

Furthermore, the thin film transistor layer is disposed between the quantum dot layer and the substrate, and the thin film transistor layer is configured to absorb the external light or the excitation light incident on its surface to perform a photoelectric conversion operation.

Furthermore, the photosensitive device further includes a light shielding layer disposed on a surface of the substrate facing or away from the photosensitive functional layer.

Furthermore, the thin film transistor layer includes at least one kind of an amorphous silicon thin film transistor and an oxide thin film transistor.

Furthermore, the quantum dot layer includes an adhesive layer and a plurality of quantum dots filled in the adhesive layer.

Furthermore, the quantum dot layer is configured to emit the excitation light having a wavelength within a predetermined wavelength range under the excitation of the external light. The thin film transistor layer has a highest absorption intensity of the excitation light.

Furthermore, the thin film transistor layer includes a gate, a first insulating layer, an active layer, a source, a drain, a second insulating layer, a first electrode, and a second electrode. The gate is disposed on the substrate or the quantum dot layer. The first insulating layer is disposed on the gate and covers the gate and the substrate or the quantum dot layer. The active layer is disposed on the first insulating layer and covers the first insulating layer. The source and the drain are disposed on the active layer and respectively disposed at two opposite edge regions of the active layer. The second insulating layer is disposed on the source and the drain and covers the source, the drain, and the active layer. The first electrode and the second electrode are disposed on the second insulating layer and respectively disposed in regions of the second insulating layer corresponding to the source and the drain. The second electrode is electrically connected to the drain.

The present disclosure provides a display panel including any one of the photosensitive devices described above.

The present disclosure provides a display device, the display device includes any one of the photosensitive devices, or includes the display panel.

In the photosensitive device of the present disclosure, the photosensitive functional layer is formed by the quantum dot layer and the thin film transistor layer. The quantum dots emit light having the wavelength within the predetermined wavelength range under the excitation of the external light, and the thin film transistor layer has the highest absorption intensity of the light. Thus, a photoelectric current conversion rate of the thin film transistor layer is improved. The light shielding layer is disposed on the surface of the substrate, so the photosensitive device of the present disclosure can better block an influence of a backlight source of the substrate on the photosensitive device, thereby improving accuracy and sensitivity of the photosensitive device. The photosensitive device of the present disclosure can avoid the technical problem that the photosensitive device has different light absorption intensities for light sources having different wavelengths, thereby improving versatility and applications of the photosensitive device in multi-wavelength light sources.

The display panel of the present disclosure adopts the photosensitive device of the present disclosure to realize light source sensing and image conversion functions.

DESCRIPTION OF SPECIFIC EMBODIMENTS OF THE INVENTION

Figure 1:
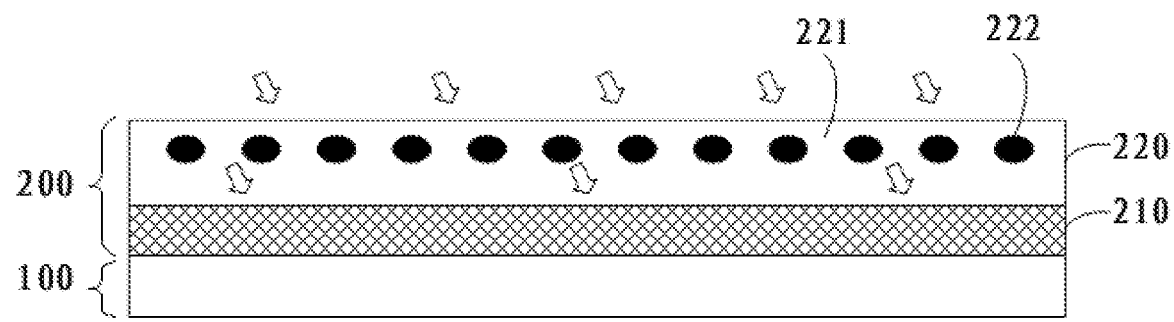
FIG. 1 is a schematic diagram of a photosensitive device of a first embodiment of the present disclosure.

The present disclosure provides a physical keyboard input system, a keyboard input method, and a storage medium. In order to make the purpose, technical solutions, and effects of the present disclosure clearer and specific, the present disclosure will be further described in detail with reference to the accompanying drawings and embodiments. It should be understood that the specific embodiments described herein are only used to explain the present disclosure, and are not used to limit the present disclosure.

The present disclosure provides a photosensitive device. The photosensitive device includes a substrate 100 and a photosensitive functional layer 200 disposed on the substrate 100. The photosensitive functional layer 200 includes a thin film transistor layer 210 and a quantum dot layer 220.

The quantum dot layer 220 is configured to emit an excitation light under an irradiation of an external light. The thin film transistor layer 210 is configured to perform a photoelectric conversion operation according to the external light or the excitation light that it absorbs and is incident on its surface. Specifically, the thin film transistor layer 210 is configured to generate a photosensitive signal according to the external light or the excitation light absorbed by the thin film transistor layer 210 with the cooperation of an external circuit. In a specific embodiment, the photosensitive signal may be a photo-generated current signal.

Specifically, the quantum dot layer 220 is configured to excite the excitation light having a wavelength within the predetermined wavelength range under the irradiation of the external light. The thin film transistor layer 210 has the highest absorption intensity for the excitation light in the predetermined wavelength range.

Hence, the photosensitive device of the present disclosure uses the thin film transistor layer 210 and the quantum dot layer 220 to increase the conversion rate of photocurrent. Moreover, by arranging the quantum dot layer 220, the photosensitive device of the present disclosure can cause the quantum dot layer 220 to excite the excitation light having the wavelength within the predetermined wavelength range with the highest absorption of the photosensitive unit 210 under the irradiation of the external light, so as to prevent the problem of different absorption intensities caused by the photosensitive device from being affected by different wavelengths of light sources, thereby improving the versatility and stability of the photosensitive device. In addition, the photosensitive device of the present disclosure also solves the problems of the existing photosensitive TFT, for example, the light absorption intensity or photogenerated current efficiency is affected by an internal structure or film layers of the photosensitive TFT and the wavelength of the light source. This improves the stability and adaptability of the photosensitive device, and expands the use and development range of the photosensitive TFT.

As shown in FIG. 1, the substrate 100 may be made of suitable materials, such as glass materials, quartz, metal materials, and plastic materials including polyethylene terephthalate (PET), polyethylene naphthalate (PEN), or polyimide.

In a preferred embodiment, the substrate 100 is an array substrate or a color filter substrate. By integrating the photosensitive device on the array substrate or the color filter substrate, the photosensitive device can be integrated into a display panel or a display device. Therefore, the display panel or the display device itself has a function of detecting a light intensity, thereby improving a detection sensitivity of the light intensity of the display panel or the display device, reducing additional or external light sensors or photosensitive elements, saving a space inside an electronic equipment, and saving costs.

As shown in FIG. 1, the thin film transistor layer 210 is disposed on a surface of the substrate 100. The thin film transistor layer 210 is configured to generate photosensitive signals in cooperation with an external circuit according to the external light absorbed by the thin film transistor layer 210 and incident on it or the excitation light emitted by the quantum dot layer 220.

Specifically, the thin film transistor layer 210 includes at least one kind of an amorphous silicon thin film transistor or an oxide thin film transistor. That is, the thin film transistor layer 210 includes at least one or a plurality of thin film transistors T, and the thin film transistors T may be amorphous silicon thin film transistors or oxide thin film transistors.

Figure 5:
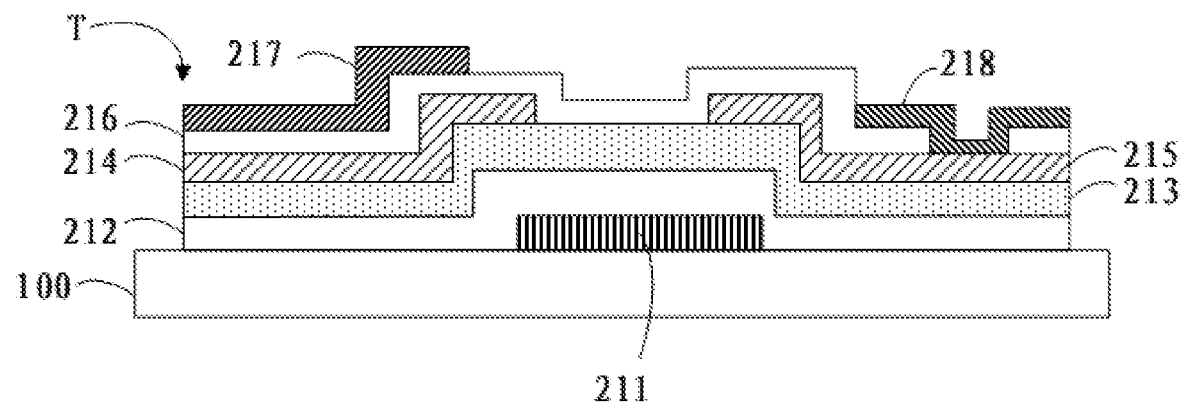
FIG. 5 is a structural diagram of a thin film transistor of an embodiment of the present disclosure.

FIG. 5 is a structural diagram of a thin film transistor of an embodiment of the present disclosure. A structure of the thin film transistor T of the present disclosure will be described in detail below in conjunction with FIG. 5.

As shown in FIG. 5, the thin film transistor T includes a gate 211, a first insulating layer 212, an active layer 222, a source 214, a drain 215, a second insulating layer 216, a first electrode 217, and a second electrode 218.

As shown in FIG. 5, the gate 211 is disposed on a surface of the substrate 100. The first insulating layer 212 is disposed on the gate 211 and covers the gate 211 and the substrate 110. The active layer 222 is disposed on the first insulating layer 212 and covers the first insulating layer 212. The source 214 and the drain 215 are both disposed on the active layer 222 and are respectively disposed at two opposite edge regions of the active layer 222. The second insulating layer 216 is disposed on the source 214 and the drain 215 and covers the source 214, the drain 215, and the active layer 222. The first electrode 217 and the second electrode 218 are disposed on the second insulating layer 216 and are respectively disposed in regions of the second insulating layer 216 corresponding to the source 214 and the drain 215. The second electrode 218 is electrically connected to the drain 215.

Alternatively, the active layer 222 is an amorphous silicon layer or an oxide layer. The amorphous silicon layer or the oxide layer is sensitive to light and has a good photosensitive performance.

The first electrode 217 and/or the second electrode 218 are used for electrical connection between a plurality of thin film transistors T, so as to transmit a signal of the drain 215 of one thin film transistor T to other thin film transistors T. For example, in a preferred embodiment, the first electrode 217 of a thin film transistor T can be electrically connected to the second electrode 218 of another thin film transistor T.

In other embodiments, the first electrode 217 and/or the second electrode 218 can also be used for electrical connection with an external circuit, so as to transmit the signal of the drain 215 of the thin film transistor T to the external circuit. In a specific embodiment, the external circuit may be, but is not limited to, a detection circuit or a signal amplification circuit.

Specifically, the first electrode 217 and the second electrode 218 are both transparent electrodes. Specifically, the first electrode 217 and the second electrode 218 are used to electrically connect with the corresponding electrodes, and to realize a light transmission function.

In a specific embodiment, the first electrode 217 and the second electrode 218 are made of materials that can be used to make transparent electrodes. The material used for making the transparent electrode may be, but not limited to, indium tin oxide or indium zinc oxide. For example, in this embodiment, the first electrode 217 and the second electrode 218 are both made of indium tin oxide (ITO).

Figure 4:
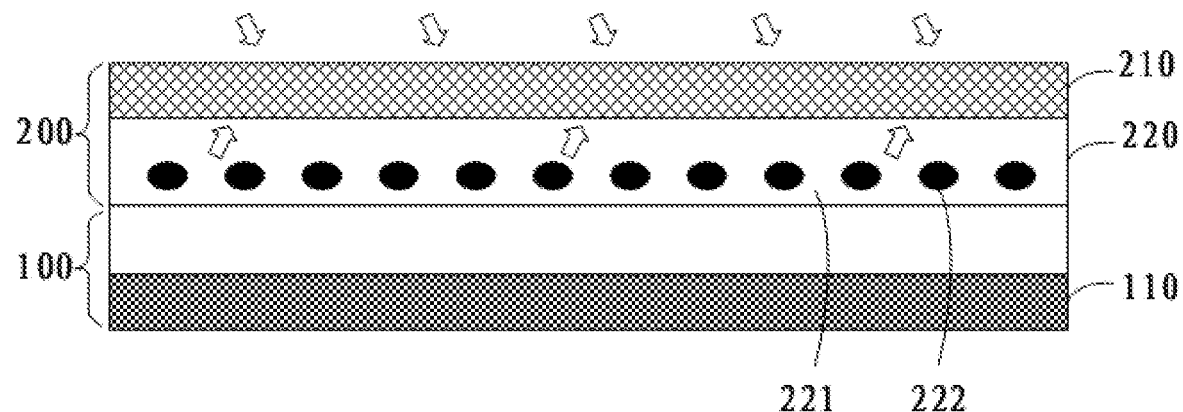
FIG. 4 is a schematic diagram of a photosensitive device of a fourth embodiment of the present disclosure.

It should be pointed out that FIG. 4 is only a schematic diagram of the thin film transistor. In a specific embodiment, the thin film transistor T may also adopt other structures or types of thin film transistors. For example, the thin film transistor T may be a top gate type indium gallium zinc oxide (IGZO) TFT, a top gate type indium gallium zinc titanium oxide (IGZTO) TFT, or a back channel etched (BCE) type IGZO TFT.

In addition, it should be pointed out that the present disclosure does not limit the number of thin film transistors T of the thin film transistor layer 210 or the connection relationship between the thin film transistors T. For example, the thin film transistor layer 210 may include only one thin film transistor T, or may also include two or more thin film transistors T.

For another example, in the thin film transistor layer 210, each thin film transistor T may be separately provided, or two or more thin film transistors T may be provided based on a layer structure. For example, it can be arranged according to a layer structure in which a drain of a thin film transistor T is electrically connected to a gate of another thin film transistor T, so as to effectively a response of the overall thin film transistor layer 210 to ambient light, thereby expanding an applicable range of the photosensitive device.

As shown in FIG. 1, the quantum dot layer 220 is disposed on a surface of the thin film transistor layer 210 away from the substrate 100. The quantum dot layer 220 is configured to emit the excitation light under the excitation of the external light. Through the quantum dot layer 220, an ability of the quantum dot layer 220 to excite light when irradiated by light can be used to improve the overall light absorption capability and light detection capability of the photosensitive device.

As a new type of luminescent material, quantum dots have characteristics of a narrow half-width of excitation light emitted by a light source, a concentrated wavelength range, and a wide and strong light absorption range. Thus, the external light can be converted into light having a wavelength within the predetermined wavelength range that maximizes the absorption of the thin film transistor layer 210 by adjusting the type and size of the quantum dot material. It overcomes the problem that the thin film transistor layer 210 has different absorption of light sources of different wavelengths caused by its own structure or environment.

In the photosensitive device shown in FIG. 1, when the external light is incident on the photosensitive device from a surface of the quantum dot layer 220 away from the substrate 100, the external light will excite the quantum dot layer 210 to emit excitation light. Then, the excitation light and the external light not absorbed by the quantum dot layer 220 pass through the quantum dot layer 220 and enter the thin film transistor layer 210. The thin film transistor layer 210 absorbs light incident on its surface to perform a photoelectric conversion operation.

By disposing the quantum dot layer 220 on the surface of the thin film transistor layer 210 away from the substrate 100, it is possible to convert all or most of the external light incident on the photosensitive device into light having a wavelength within the predetermined wavelength range that maximizes the absorption intensity of the thin film transistor layer 210. Thus, the photo-generated current efficiency of the photosensitive device can be improved, and the stability and versatility of the photosensitive device can also be improved.

Specifically, the quantum dot layer 220 is configured to excite the excitation light having a wavelength within the predetermined wavelength range under the irradiation of the external light, and the thin film transistor layer 210 has the highest absorption intensity for the excitation light.

In a preferred embodiment, the quantum dot layer 220 includes an adhesive layer 221 and quantum dots 222 filled within the adhesive layer.

In this embodiment, the adhesive layer 221 is made of photoresist. In other embodiments, the adhesive layer 221 may also made of other adhesive materials, such as, but not limited to, one or more of hydrogel, optical adhesive, and resin.

Specifically, the quantum dots 222 are oil-soluble or water-soluble. The quantum dot 222 has a spherical shape, a rod shape, or a fiber shape. The quantum dot 222 includes a light-emitting core and an inorganic protective shell layer wrapped around the light-emitting core. A red light material of the light-emitting core includes one or more of cadmium selenide (CdSe) and indium arsenide (InAs). A green light material of the light-emitting core includes one or more of indium phosphide (InP) and cadmium sulfoselenide (Cd2SSe). The inorganic protective shell layer is selected from a group of materials consisting of cadmium sulfide (CdS), zinc selenide (ZnSe), zinc sulfide (ZnS), and zinc oxide (ZnO).

In a specific embodiment, the material or size of the quantum dot 222 can be set or adjusted according to the wavelength range of the maximum absorption corresponding to the thin film transistor layer 210.

The quantum dot layer 220 may be a single-layer film structure, or a multilayer laminated film structure. In other words, the photosensitive device of the present disclosure does not limit the specific structure or thickness of the quantum dot layer 220. In specific embodiment, it is only necessary to ensure that the quantum layer 220 can convert more external light into light having the wavelength within the predetermined wavelength range and provide the light having the wavelength within the predetermined wavelength range to the thin film transistor layer 210. Alternatively, as long as it helps to improve the efficiency of the photogenerated current of the thin film transistor layer 210.

As shown in FIG. 1, in this embodiment, the quantum dot layer 220 has a single-layer film structure.

Figure 2:
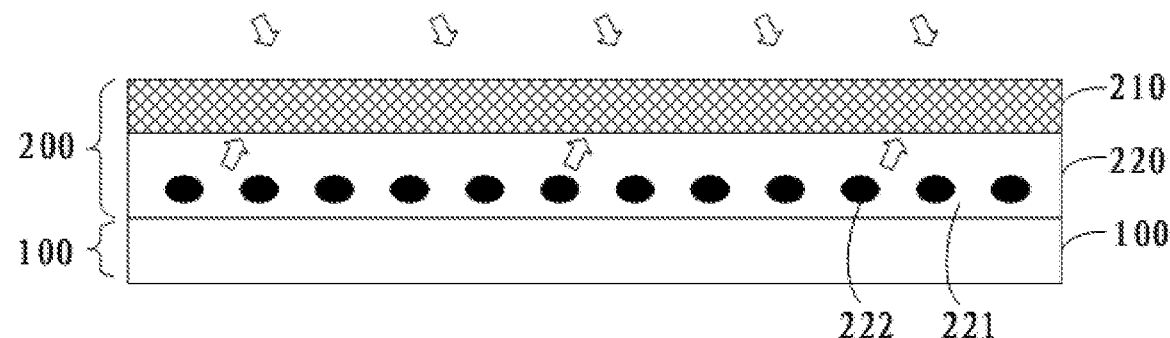
FIG. 2 is a schematic diagram of a photosensitive device of a second embodiment of the present disclosure.

FIG. 2 is a schematic diagram of a photosensitive device of a second embodiment of the present disclosure. In comparison with the photosensitive device shown in FIG. 1, as shown in FIG. 2, in the photosensitive device of this embodiment, the quantum dot layer 220 is disposed between the thin film transistor layer 210 and the substrate 100. Specifically, as shown in FIG. 2, in this embodiment, the quantum dot layer 220 is disposed on a surface of the substrate 100, and the thin film transistor layer 210 is disposed on a surface of the quantum dot layer 220 away from the substrate 100.

By disposing the quantum dot layer 220 between the thin film transistor layer 210 and the substrate 100, and disposing it away from the surface of the substrate 100, it is possible to convert all or most of the external light incident on the photosensitive device into light having a wavelength within the predetermined wavelength range that maximizes the absorption intensity of the thin film transistor layer 210. Thus, the photo-generated current efficiency of the photosensitive device can be improved, and the stability and versatility of the photosensitive device can also be improved.

For example, as shown in FIG. 2, in this embodiment, the thin film transistor layer 210 is disposed on the substrate 100, and the quantum dot layer 220 is disposed on the surface of the thin film transistor layer 210 away from the substrate 100.

Referring to FIG. 2, in this embodiment, the external light is incident on the photosensitive device from the surface of the thin film transistor layer 210 away from the substrate 100. At least part of the external light not absorbed by the thin film transistor layer 210 can be incident on the quantum dot layer 220. The quantum dot layer 220 emits excitation light under the excitation of external light incident on its surface. The excitation light can irradiate the thin film transistor layer 210. The thin film transistor layer 210 absorbs the external light and the excitation light to perform a photoelectric conversion operation.

Figure 3:
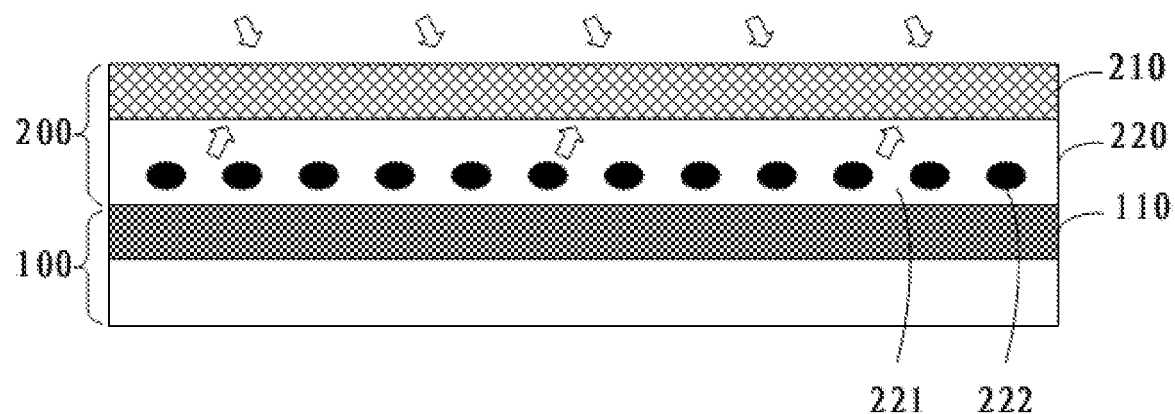
FIG. 3 is a schematic diagram of a photosensitive device of a third embodiment of the present disclosure.

FIG. 3 is a schematic diagram of a photosensitive device of a third embodiment of the present disclosure. In comparison with the photosensitive device shown in FIG. 1, as shown in FIG. 3, the photosensitive device described in this embodiment has the following distinguishing characteristics: (1) a light shielding layer 110 is disposed on a surface of the substrate 100 facing the photosensitive functional layer 200; (2) the quantum dot layer 220 is disposed between the thin film transistor layer 210 and the light shielding layer 110.

By disposing the light shielding layer 110 on the surface of the substrate 100 facing the quantum dot layer 210, an influence of a light source disposed on a back of the substrate 100 on the thin film transistor layer 210 or the quantum dot layer 220 can be blocked. It prevents other light sources from affecting the sensitivity and accuracy of the photosensitive device.

For example, as shown in FIG. 3, in this embodiment, the light shielding layer 110 is disposed between the substrate 100 and the quantum dot layer 220, and the thin film transistor layer 210 is disposed on a surface of the quantum dot layer 220 away from the light shielding layer 110.

Referring to FIG. 3, in this embodiment, the external light is incident on the photosensitive device from the surface of the thin film transistor layer 210 away from the substrate 100. At least part of the external light not absorbed by the thin film transistor layer 210 can be incident on the quantum dot layer 220. The quantum dot layer 220 emits excitation light under the excitation of external light incident on its surface. Most or all of the excitation light can irradiate the thin film transistor layer 210 under the blocking effect of the light shielding layer. The thin film transistor layer 210 absorbs the external light and the excitation light to perform a photoelectric conversion operation.

Apparently, in this implementation, the light shielding layer 110 can block the excitation light emitted by the quantum dot layer 220 from passing through the substrate 100, and can also block light incident on a side of the substrate 100 away from the light shielding layer 110.

In a specific embodiment, the light shielding layer 110 is made of black photoresist. In other embodiments, the light shielding layer 110 can be made of resin with carbon black. In other words, the photosensitive device described in the present disclosure does not limit the material of the light shielding 140.

FIG. 4 is a schematic diagram of a photosensitive device of a fourth embodiment of the present disclosure. In comparison with the photosensitive device shown in FIG. 1, as shown in FIG. 4, the photosensitive device described in this embodiment has the following distinguishing characteristics: (1) a light shielding layer 110 is disposed on a surface of the substrate 100 away from the photosensitive functional layer 200; (2) the quantum dot layer 220 is disposed between the thin film transistor layer 210 and the substrate 100.

The light shielding layer 110 can also prevent the excitation light emitted by the quantum dot layer 220 from passing through the substrate 100, and can also prevent the external light from entering the photosensitive functional layer 200 from the substrate 100. In other words, by arranging the light shielding layer 110 on the surface of the substrate 100 away from the quantum dot layer 210, other light sources can also be prevented from affecting the detection sensitivity and accuracy of the photosensitive device.

Similarly, the material of the light shielding layer 110 can be, but is not limited to, black photoresist or resin with carbon black.

The present disclosure also provides a display panel, and the display panel includes at least one photosensitive device. The photosensitive device is the photosensitive device described in the present disclosure. Please refer to the above for the specific structure of the photosensitive device, which will not be repeated here.

The display panel of the present disclosure does not require an external light sensor, and by setting the photosensitive device, it has the function of detecting the backlight source and external light intensity. Thus, the detection sensitivity of the light intensity of electronic equipment such as mobile terminals is improved, additional light sensors or photosensitive elements to the electronic equipment is reduced, a space inside the electronic equipment is saved, and the cost is saved.

The present disclosure also provides a display device. The display device includes the display panel described in the present disclosure, or the photosensitive device described in the present disclosure. Please refer to the above for the structure of the display panel or the photosensitive device, and will not be repeated here.

The display device of the present disclosure does not require an external light sensor, and by setting the photosensitive device, it has the function of detecting the backlight source and external light intensity. Thus, the detection sensitivity of the light intensity of electronic equipment such as mobile terminals is improved, additional light sensors or photosensitive elements to the electronic equipment is reduced, a space inside the electronic equipment is saved, and the cost is saved.

The present disclosure relates to the photosensitive device and the display panel. The photosensitive device can convert the external light into light having the wavelength within the predetermined wavelength range by setting the quantum dot layer, thereby improving the photo-generated current efficiency of the thin film transistor layer 210. In this way, the photosensitive device of the present disclosure can overcome the problem of low versatility of the existing thin film transistors or photosensitive devices integrated by thin film transistors, and further improve the use and development of the photosensitive device integrated by thin film transistors.

It can be understood that for those of ordinary skill in the art, equivalent replacements or changes can be made according to the technical solutions of the present disclosure and its inventive concept, and all these changes or replacements shall fall within the protection scope of the appended claims of the present disclosure.

What is claimed is:

1. A photosensitive device, comprising:
a substrate;
a photosensitive functional layer disposed on the substrate, wherein the photosensitive functional layer comprises a thin film transistor layer and a quantum dot layer; and
a light shielding layer disposed on a surface of the substrate away from the photosensitive functional layer;
wherein the quantum dot layer is disposed on the substrate and is configured to emit an excitation light having a wavelength within a predetermined wavelength range under an excitation of an external light, and the thin film transistor layer has a highest absorption intensity of the excitation light; and
wherein the thin film transistor layer comprises at least one kind of an amorphous silicon thin film transistor and an oxide thin film transistor; and
wherein the thin film transistor layer is disposed on a surface of the quantum dot layer facing away from or facing the substrate, and the thin film transistor layer is configured to absorb the external light or the excitation light incident on its surface to perform a photoelectric conversion operation;
wherein the quantum dot layer comprises an adhesive layer and a plurality of quantum dots filled in the adhesive layer, and the adhesive layer is made of photoresist;
wherein the quantum dot layer is disposed between the thin film transistor layer and the substrate and is spaced from the light shielding layer, and the light shielding layer is made of resin with carbon black.

2. The photosensitive device according to claim 1, wherein the thin film transistor layer comprises:
a gate disposed on the substrate or the quantum dot layer;
a first insulating layer disposed on the gate and covering the gate and the substrate or the quantum dot layer;
an active layer disposed on the first insulating layer and covering the first insulating layer;
a source and a drain disposed on the active layer and respectively disposed at two opposite edge regions of the active layer;
a second insulating layer disposed on the source and the drain and covering the source, the drain, and the active layer; and a first electrode and a second electrode disposed on the second insulating layer and respectively disposed in regions of the second insulating layer corresponding to the source and the drain, wherein the second electrode is electrically connected to the drain.

3. A photosensitive device, comprising:
a substrate;
a photosensitive functional layer disposed on the substrate, wherein the photosensitive functional layer comprises a thin film transistor layer and a quantum dot layer; and
a light shielding layer disposed on a surface of the substrate away from the photosensitive functional layer;
wherein the quantum dot layer is configured to emit an excitation light having a wavelength within a predetermined wavelength range under an excitation of an external light, and
wherein the thin film transistor layer comprises at least one kind of an amorphous silicon thin film transistor and an oxide thin film transistor; and
wherein the thin film transistor layer has a highest absorption intensity of the excitation light;
wherein the quantum dot layer comprises an adhesive layer and a plurality of quantum dots filled in the adhesive layer, and the adhesive layer is made of photoresist;
wherein the quantum dot layer is disposed between the thin film transistor layer and the substrate and is spaced from the light shielding layer, and the light shielding layer is made of resin with carbon black.

4. The photosensitive device according to claim 3, wherein the thin film transistor layer is disposed on a surface of the quantum dot layer facing away from the substrate, and the thin film transistor layer is configured to absorb the external light or the excitation light incident on its surface to perform a photoelectric conversion operation.

5. The photosensitive device according to claim 3, wherein the thin film transistor layer is disposed between the quantum dot layer and the substrate, and the thin film transistor layer is configured to absorb the external light or the excitation light incident on its surface to perform a photoelectric conversion operation.

6. The photosensitive device according to claim 3, wherein the thin film transistor layer comprises:
a gate disposed on the substrate or the quantum dot layer;
a first insulating layer disposed on the gate and covering the gate and the substrate or the quantum dot layer;
an active layer disposed on the first insulating layer and covering the first insulating layer;
a source and a drain disposed on the active layer and respectively disposed at two opposite edge regions of the active layer;
a second insulating layer disposed on the source and the drain and covering the source, the drain, and the active layer; and
a first electrode and a second electrode disposed on the second insulating layer and respectively disposed in regions of the second insulating layer corresponding to the source and the drain, wherein the second electrode is electrically connected to the drain.

7. A display panel, comprising a photosensitive device, wherein the photosensitive device comprises a substrate, a photosensitive functional layer disposed on the substrate, and a light shielding layer disposed on a surface of the substrate away from the photosensitive functional layer;
wherein the photosensitive functional layer comprises a thin film transistor layer and a quantum dot layer; and
wherein the thin film transistor layer comprises at least one kind of an amorphous silicon thin film transistor and an oxide thin film transistor; and
wherein the quantum dot layer is configured to emit an excitation light having a wavelength within a predetermined wavelength range under an excitation of an external light, and
wherein the thin film transistor layer has a highest absorption intensity of the excitation light;
wherein the quantum dot layer comprises an adhesive layer and a plurality of quantum dots filled in the adhesive layer, and the adhesive layer is made of photoresist;
wherein the quantum dot layer is disposed between the thin film transistor layer and the substrate and is spaced from the light shielding layer, and the light shielding layer is made of resin with carbon black.

* * * * *